United States Patent
Yonehama et al.

(10) Patent No.: US 7,064,375 B2
(45) Date of Patent: Jun. 20, 2006

(54) SEMICONDUCTOR MEMORY DEVICE HAVING A GATE ELECTRODE AND A DIFFUSION LAYER AND A MANUFACTURING METHOD THEREOF

(75) Inventors: Keisuke Yonehama, Mie-ken (JP); Eiji Sakagami, Mie-ken (JP); Hiromasa Fujimoto, Kanagawa-ken (JP); Naoki Koido, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/602,595

(22) Filed: Jun. 25, 2003

(65) Prior Publication Data

US 2004/0079985 A1    Apr. 29, 2004

(30) Foreign Application Priority Data

Oct. 29, 2002    (JP) ............................. 2002-314627

(51) Int. Cl.
 *H01L 29/76* (2006.01)
(52) U.S. Cl. .................. 257/314; 257/296; 257/298
(58) Field of Classification Search ........ 257/314–326, 257/296–306
See application file for complete search history.

(56) References Cited

U.S. PATENT DOCUMENTS

| | | |
|---|---|---|
| 5,659,500 A | 8/1997 | Mehrad |
| 6,451,642 B1 | 9/2002 | Mehrad et al. |
| 6,703,676 B1 * | 3/2004 | Hirai et al. .................. 257/421 |
| 6,731,538 B1 * | 5/2004 | Noda et al. ............. 365/185.11 |
| 2001/0008311 A1 * | 7/2001 | Harada et al. ............... 257/758 |

FOREIGN PATENT DOCUMENTS

| | | |
|---|---|---|
| JP | 6-334156 | 12/1994 |
| JP | 7-74326 | 3/1995 |
| JP | 9-129854 | 5/1997 |
| JP | 10-326896 | 12/1998 |
| JP | 11-265947 | 9/1999 |
| JP | 2001-68571 | 3/2001 |
| JP | 2002-76147 | 3/2002 |

OTHER PUBLICATIONS

H. Watanabe, et al. "Novel 0.44 $\mu m^2$Ti-Salicide STI Cell Technology for High-Density NOR Flash Memories and High Performance Embedded Application," IEDM 98-975.
U.S. Appl. No. 10/602,595, filed Jun. 25, 2003, Yonehama et al.
U.S. Appl. No. 10/927,324, filed Aug. 27, 2004, Sakagami.

* cited by examiner

*Primary Examiner*—Douglas W. Owens
(74) *Attorney, Agent, or Firm*—Oblon, Spivak, McClelland, Maier & Neustadt, P.C.

(57) ABSTRACT

A semiconductor memory device, including a first memory cell having a first gate electrode, a first diffusion layer, and a second diffusion layer; a first contact layer connected to the first diffusion layer of the first memory cell; a second contact layer connected to the first contact layer; a second memory cell having a second gate electrode, a third diffusion layer and a fourth diffusion layer, the second gate electrode of the second memory cell electrically connected to the first gate electrode of the first memory cell, the first and second memory cells arranged in a direction perpendicular to the first bit line; and a conductive layer commonly connected to the second diffusion layer of the first memory cell and the fourth diffusion layer of the second memory cell, a height of the conductive layer substantially being coplanar with a height of the first contact layer.

30 Claims, 12 Drawing Sheets

214a1 and 214b1:Ti layer
214a2 and 214b2:W layer

214a1 and 214b1: Ti layer
214a2 and 214b2: W layer

214a1 and 214b1:Ti layer
214a2 and 214b2:W layer

SEMICONDUCTOR MEMORY DEVICE HAVING A GATE ELECTRODE AND A DIFFUSION LAYER AND A MANUFACTURING METHOD THEREOF

CROSS-REFERENCE TO RELATED APPLICATION

This application is based upon and claims the benefit of priority from the prior Japanese Patent Application No. 2002-314627, filed Oct. 29, 2002, the entire contents of which are incorporated herein by reference.

BACKGROUND OF THE INVENTION

1. Field of the Invention

This present invention relates to a semiconductor memory device and a manufacturing method thereof, for example, a nonvolatile semiconductor memory device and its manufacturing method that are suitable for high integrality.

2. Description of the Related Art

Figure 8:
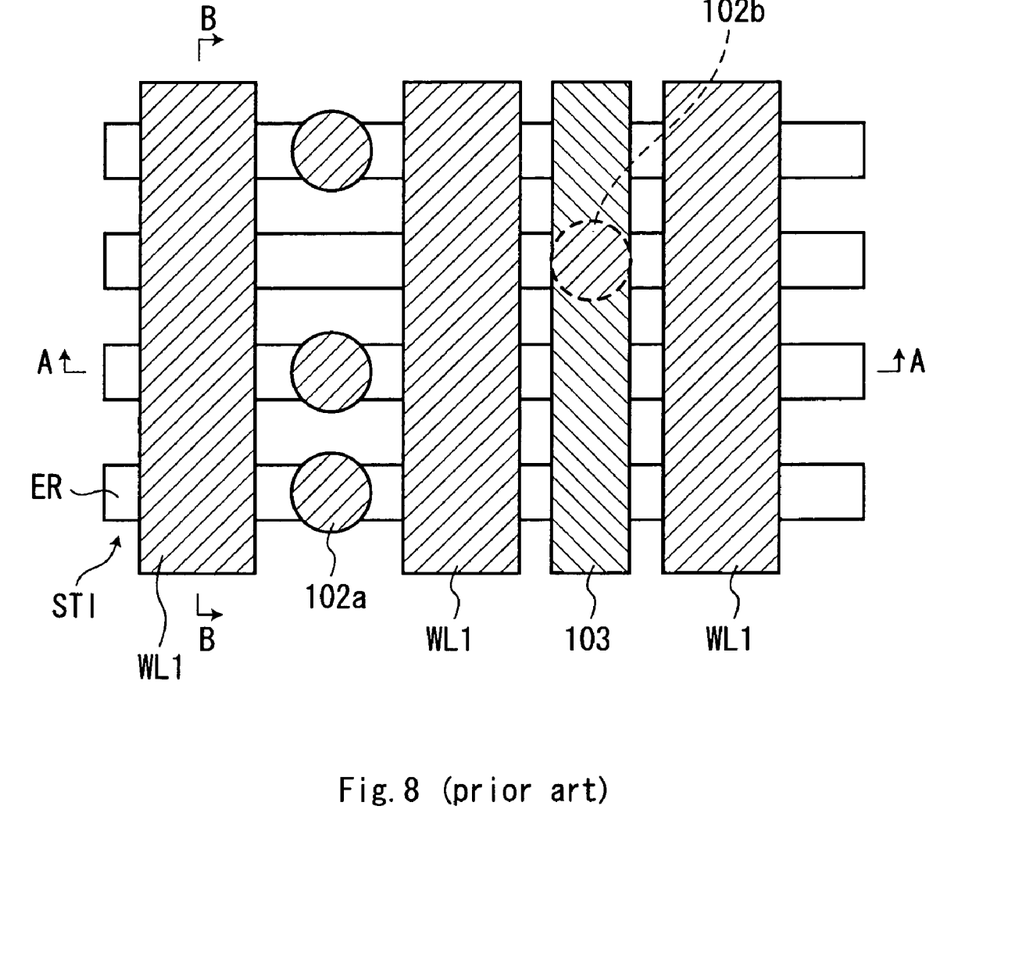
FIG. 8 shows a top view of a conventional non-volatile memory device.

A top view of a conventional NOR type non volatile semiconductor memory device is shown in FIG. 8. As shown in FIG. 8, a plurality of element region (ER) are arranged in a horizontal direction of the FIG. 8. Each of the element regions is electrically separated from each other by element isolation regions STI (Shallow Trench Isolation). A plurality of word lines WL1 portions of which are used as gate electrodes are arranged in a vertical direction of FIG. 8 so as to intersect each of the element regions.

Drain contacts 102a are arranged between two word lines WL1 and connects between a drain region formed on a upper surface of the semiconductor substrate 100 and a bit line 115. The drain contact 102a is used in common at memory cells that are arranged at both sides of the drain contact 102a.

A source line 103 is arranged in parallel to the word line WL1 at an opposite side where the drain contacts 102a are not formed. The source line 103 is connected to source regions that are formed on an upper surface of the semiconductor substrate 100. A source contact 102b is formed on the source line 103. The source contact 102b is connected between the source line 103 and another line (not shown) that is formed in a same layer as the bit line 115.

Figure 6:
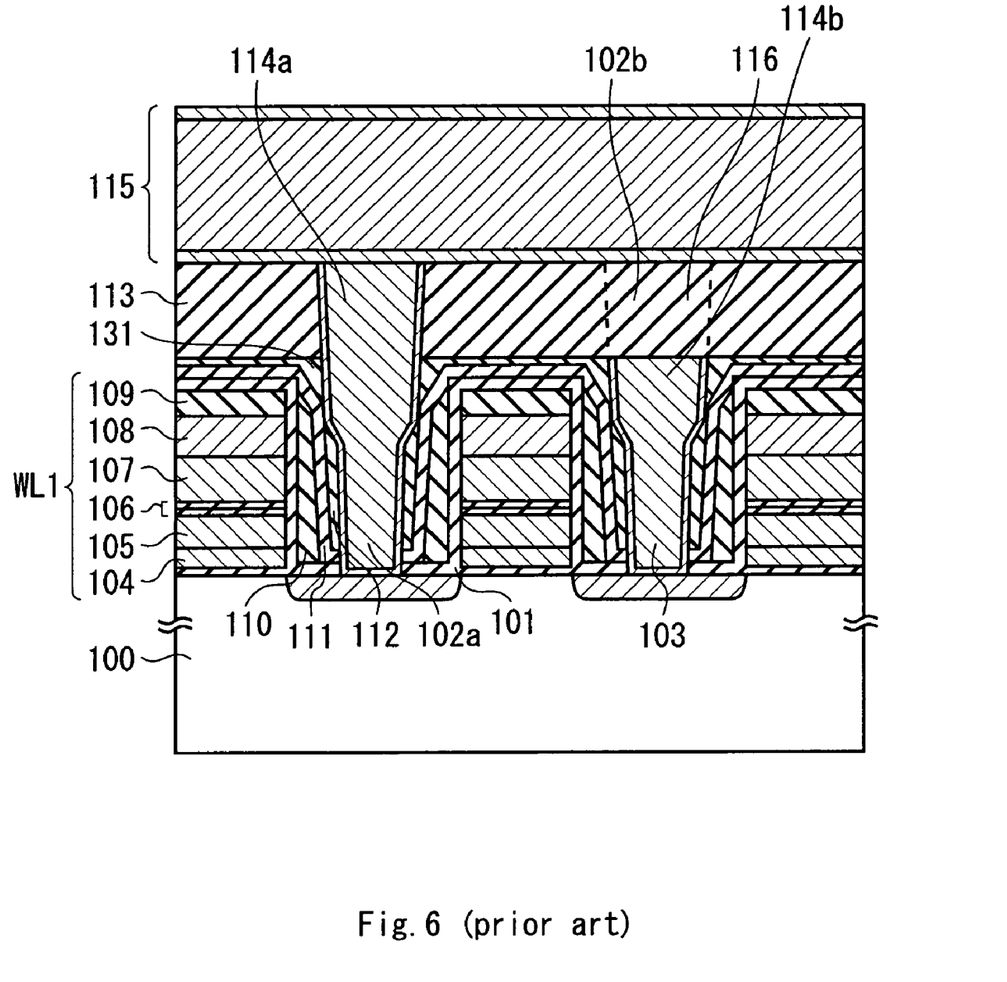
FIG. 6 shows a A—A cross sectional view of a conventional non-volatile memory device shown in FIG. 8.
Figure 7:
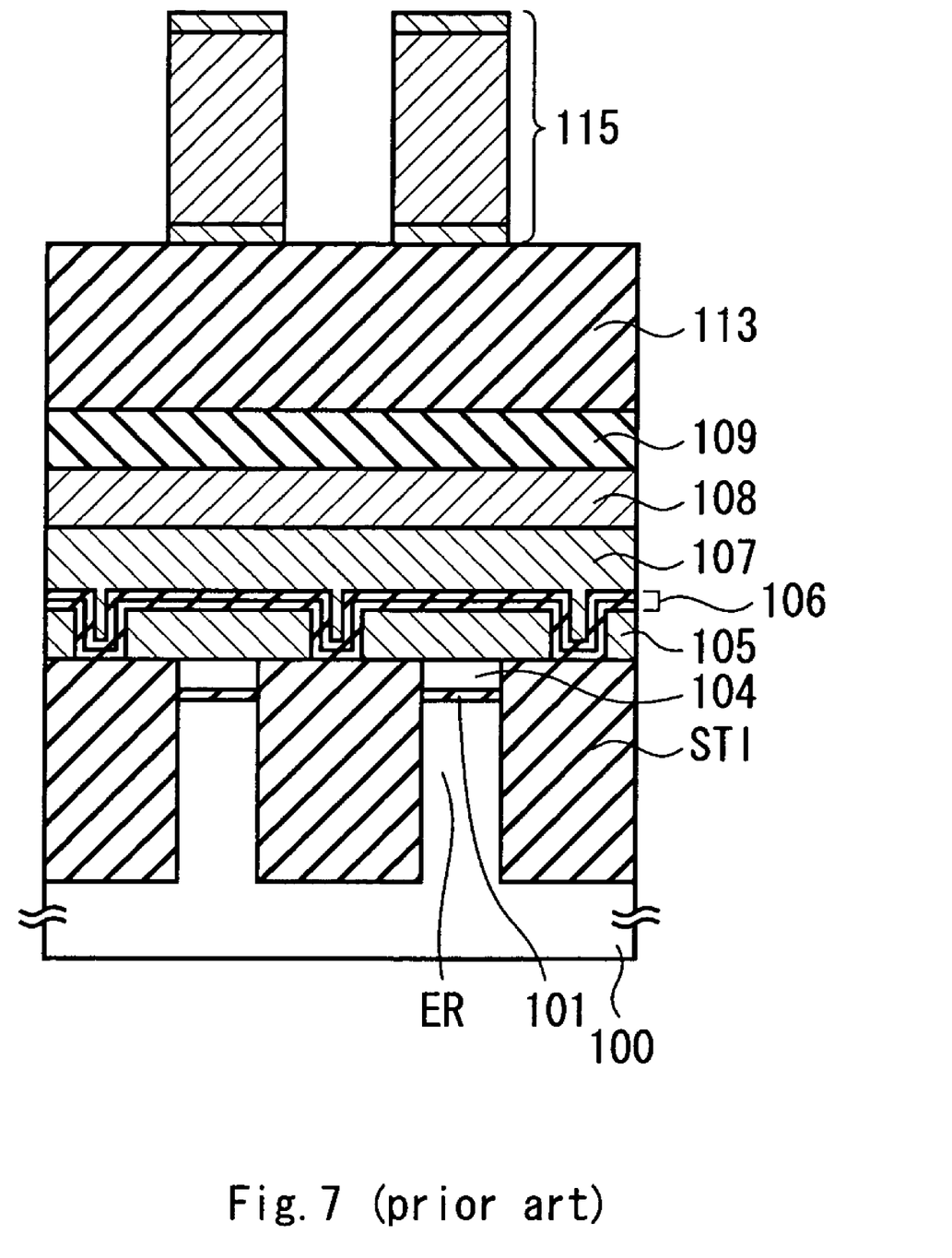
FIG. 7 shows a A—A cross sectional view of a conventional non-volatile memory device shown in FIG. 8.

FIGS. 6 and 7 show cross sectional views of the A—A and the B—B shown in FIG. 8 respectively. As shown in FIG. 8, a plurality of element isolation regions (STI) are formed on an upper surface of the semiconductor substrate 100, thereby forming a plurality of element regions each of which is arranged between the two element isolation regions. A word line WL1 is formed so as to intersect each of the element regions.

As shown in FIGS. 6 and 8, the word line WL1 is formed on a silicon oxide layer 101 (a first gate insulating film) that is formed on the semiconductor substrate 100. The word line WL1 also includes a poly crystalline silicon layer 104 that is used as a first floating gate, a poly crystalline silicon layer 105 that is used as a second floating gate, an ONO layer 106 that is used as a second gate insulating film, a control gate electrode comprised of a poly crystalline silicon layer 107 and a tungsten silicide layer 108 (WSi), and a TEOS layer 109 that was used as a mask layer to form a gate electrode.

A silicon nitride layer 110 is formed on the side surface of the word line WL1. A silicon nitride layer 111 is formed to cover the silicon nitride layer 110. Silicon oxide layers 112 and 131 are formed to fulfill between gate electrodes covered by the silicon nitride layer 111. And then, portions of the silicon oxide layers 112 and 131 are removed and flatted by using a CMP method.

Conventionally, drain contacts 102a and source line 103 are formed at different manufacturing steps. First, the source line 103 is formed, and then the drain contacts 102a are formed. Details of the manufacturing step are as follows.

Portions of a silicon oxide layer 101, a silicon nitride layer 111, silicon oxide layers 112 and 131 are removed to a direction vertical to the element region and the element isolation region, and parallel to the word line WL1 by using a RIE method (Reactive Ion Etching), thereby forming a contact hole to reach source regions that are formed on an upper surface of the semiconductor substrate 100. And then, a metal layer 114b, for instance, tungsten layer W is formed in the contact hole, thereby forming a source line 103.

After that, a silicon oxide layer 113 that is used as an interlayer insulating layer is formed and flatted by using a CMP (Chemical Mechanical Polishing) method. At positions where the source line 103 is not formed, portions of a silicon oxide layer 101, a silicon nitride layer 111, silicon oxide layers 112, 131, and 113 are removed so as to expose upper surfaces of the silicon substrate 100 by using a RIE method, thereby forming contact holes. A metal layer 114a, for instance, tungsten W is then formed in the contact hole, thereby forming drain contacts 102a. After that, a portion of the silicon oxide layer 112 is removed so as to expose an upper surface of the source line 103 by using a RIE method, thereby forming a contact hole. A metal layer 116, for instance, tungsten W is then formed in the contact hole, thereby forming a source contact 102b that electrically connects between the source line 103 and line layer (not shown).

It is noted that conventional semiconductor memory devices with source line structures are shown in following materials. IEDM98-975-978 (Novel 0.44 µm2 Ti-Salicide STI Cell Technology for High-Density NOR Flash Memories and High Performance Embedded Application), Japanese patent laid open Hei10-326896, Hei6-334156, Hei7-74325, Hei11-265947, 2002-76147, Hei9-129854, and 2001-68571.

The conventional semiconductor memory device has a following problem. In the conventional semiconductor memory device, the drain contact 102a is formed after the source line 103 and the silicon oxide layer 113 are formed. Therefore, it is necessary to form a contact hole with a depth that is total thickness of the source line 103 and the silicon oxide layer 113, and fulfill the metal layer 114a in the contact hole. In this result, an aspect ratio of the contact hole is higher and it is difficult to fulfill the metal layer 114a in the contact hole, thereby resulting in occurrence of voids and a poor conduction.

It is necessary to use different photo resist masks when a RIE method is achieved in order to form the source line 103 and the drain contact 102a. Furthermore, it is necessary to form a contact hole of the source contact 102b so as to connect between the source line 103 and a conductive line. In this result, the source contact 102b may be deviated from the source line 103, thereby resulting in a poor conduction.

SUMMARY OF INVENTION

A first aspect of the present invention is providing a semiconductor memory device, a first memory cell having a first gate electrode, a first diffusion layer and a second diffusion layer, the first and second diffusion layers arranged in a semiconductor substrate to be adjacent to the first gate electrode; a first contact layer connected to the first diffusion layer of the first memory cell; a second contact layer connected to the first contact layer; a first bit line connected to the second contact layer and arranged above the first gate electrode of the first memory cell; a second memory cell having a second gate electrode, a third diffusion layer and a fourth diffusion layer, the third and fourth diffusion layers arranged in a semiconductor substrate to be adjacent to the second gate electrode, the second gate electrode of the second memory cell electrically connected to the first gate electrode of the first memory cell, the first and second memory cells arranged in a direction perpendicular to the first bit line; a second bit line connected to the third diffusion layer, arranged above the second gate electrode of the second memory cell, and arranged parallel to the first bit line; and a conductive layer commonly connected to the second diffusion layer of the first memory cell and the fourth diffusion layer of the second memory cell, a height of the conductive layer substantially being coplanar with a height of the first contact layer.

A second aspect of the present invention is providing a semiconductor memory device, comprising: a plurality of memory cells each of which including a gate electrode and a diffusion layer; an insulating film formed above side and top surfaces of each gate electrode of the plurality of memory cells; a first interlayer insulating layer formed between two gate electrodes adjacent to each other; a first contact layer formed in the first interlayer insulating layer and connected to the diffusion layer; a second interlayer insulting layer formed on the first inter layer insulating layer; a second contact layer formed in the second interlayer insulating layer and connected to the first contact layer; a bit line connected to the second contact layer; and a conductive layer connected to at least two of the diffusion layers other than the diffusion layer connected to the first contact layer, the conductive layer formed between the two gate electrodes adjacent to each other being arranged in a direction vertical to the bit line, a height of the conductive layer substantially being coplanar with same as a height of the first contact layer.

A third aspect of the present invention is providing a method of manufacturing a semiconductor memory device having a gate electrode and a diffusion layer, comprising forming a plurality of memory cells each of which including the gate electrode and the diffusion layer; forming a first interlayer insulating film among the gate electrodes of the plurality of the memory cells; forming a first contact hole and a second contact hole, the first contact hole reaches one of the diffusion layers of the plurality of the memory cells and the second contact hole reaches at least two of the diffusion layers of the plurality of the memory cells; forming a first conductive layer in the first contact hole and a second conductive layer in the second contact hole; forming a second interlayer insulating film on the first interlayer insulating film; forming a third contact hole in the second interlayer insulating film; forming a third conductive layer in the third contact hole, the third conductive layer connected to the first conductive layer; and forming a bit line connected to the third conductive layer.

A fourth aspect of the present invention is providing a method of manufacturing a semiconductor memory device having a gate electrode and a diffusion layer, comprising forming a plurality of memory cells each of which including the gate electrode and the diffusion layer; forming a first interlayer insulating film among the gate electrodes of the plurality of the memory cells; removing portions of the first interlayer insulating film and forming a first contact hole and a second contact hole, the first contact hole reaches one of the diffusion layers of the plurality of the memory cells and the second contact hole reaches at least two of the diffusion layers of the plurality of the memory cells; forming a first conductive layer in the first contact hole and a second conductive layer in the second contact hole; forming a second interlayer insulating film on the first interlayer insulating film, the first conductive layer, and the second conductive layer; removing a portion of the second interlayer insulting film and forming a third contact hole; forming a third conductive layer in the third contact hole, the third conductive layer connected to the first conductive layer; and forming a bit line connected to the third conductive layer.

DETAILED DESCRIPTION OF THE INVENTION

Hereinafter, we will explain about an embodiment of the present invention with reference to drawings, specifically NOR type non-volatile memory device.

First Embodiment

Figure 3:
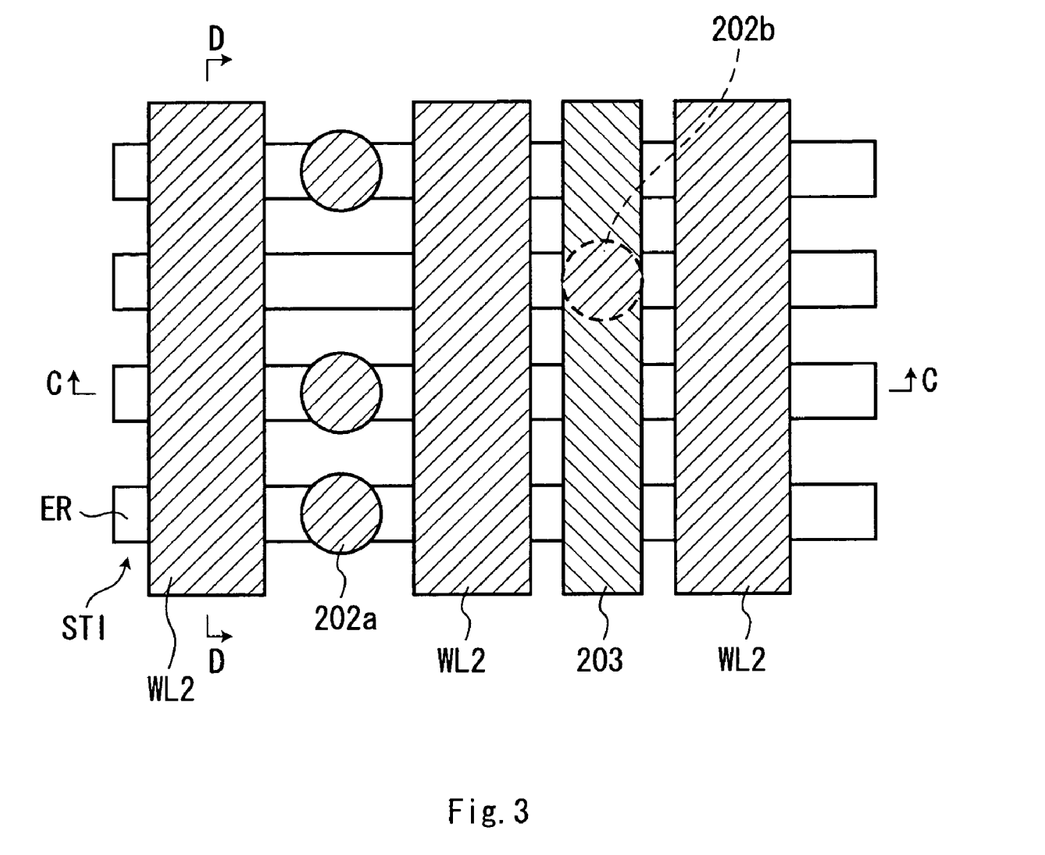
FIG. 3 shows a top view of the non-volatile memory device associated with the first embodiment of the present invention.

A top view of a first embodiment of the present invention is shown in FIG. 3. A plurality of element regions are arranged in a parallel direction in FIG. 3. Each of the element regions is electrically separated from each other by an element isolation region. A plurality of word lines WL2 are arranged in a vertical direction in FIG. 3 so as to intersect each of the element regions.

Figure 1:
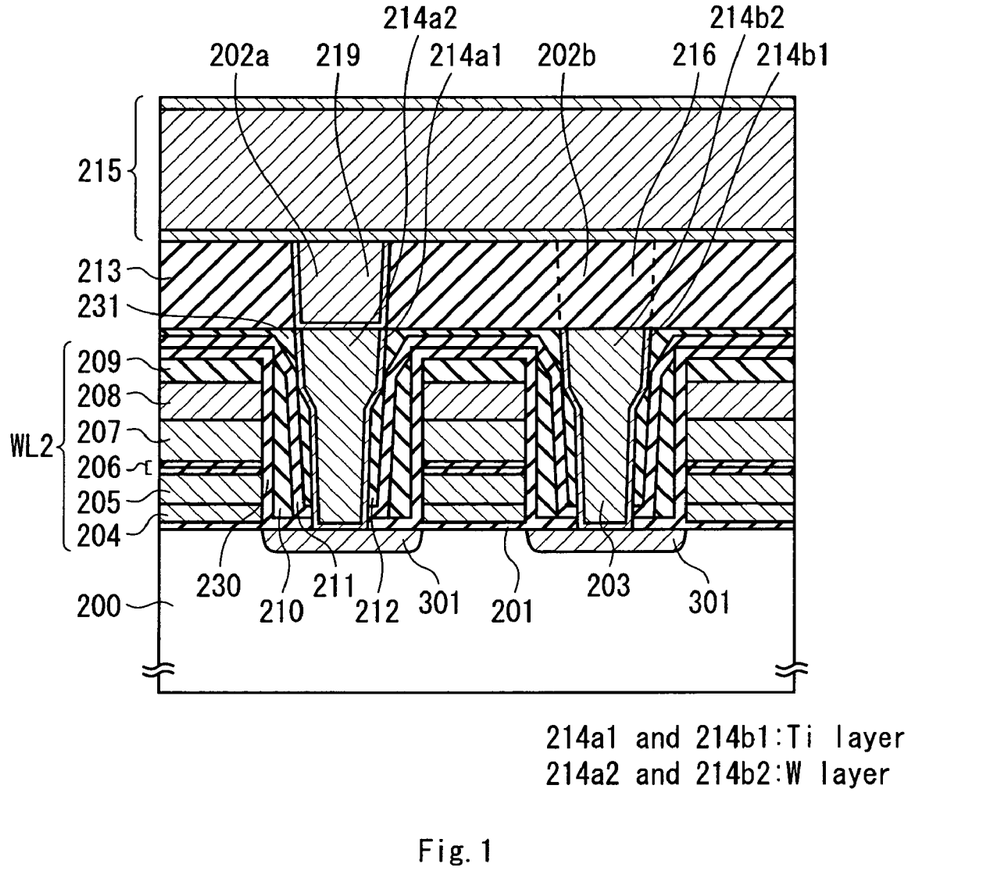
FIG. 1 shows a C—C cross sectional view of a non-volatile memory device associated with a first embodiment of the present invention shown in FIG. 3.
Figure 2:
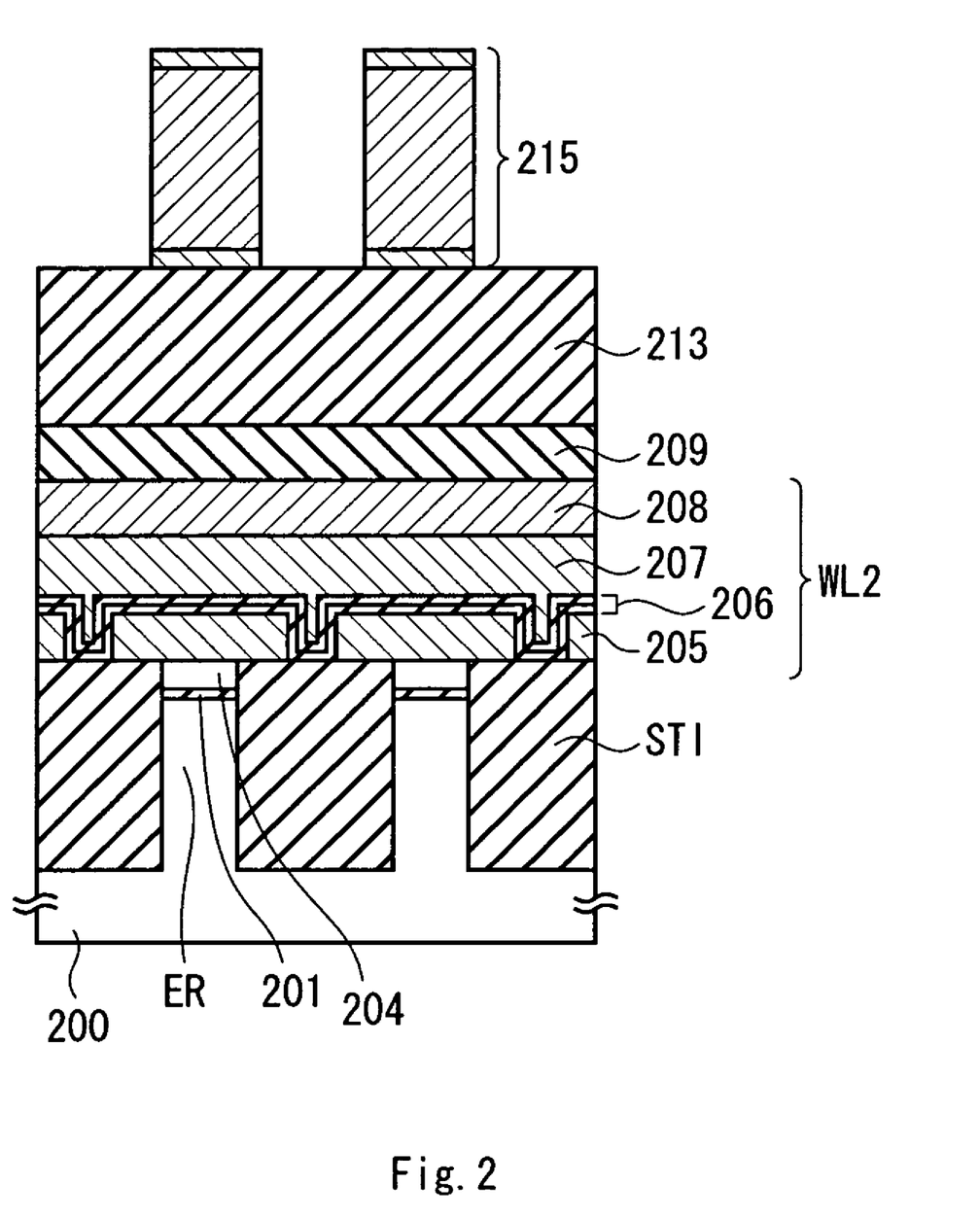
FIG. 2 shows a D—D cross sectional view of the non-volatile memory device associated with the first embodiment of the present invention shown in FIG. 3.

A C—C cross sectional view in FIG. 3 is shown in FIG. 1 and a D—D cross sectional view in FIG. 3 is shown in FIG. 2. As shown in FIGS. 1 and 2, a drain contact 202a that connects between a bit line 215 and a drain region formed on an upper surface of a semiconductor substrate 200 is formed. The drain contact 202a is used in common at memory cells that are arranged at both sides of the drain contact 202a. It is noted that the bit line 215 may be comprised of, for instance, one of a barrier metal Ti and a barrier metal TiN, a metal layer, and one of a barrier metal Ti and a barrier metal TiN.

A source line 203 that is parallel to the word lines WL2 is arranged and connected to source regions 301 that are formed on upper surfaces of the semiconductor substrate 200. A source contact 202b is formed on the source line 203 and connects between a conductive line (not shown) and the source line 203.

As shown in FIG. 2, element isolation regions STI are formed on the upper surface of the semiconductor substrate 200, thereby resulting in forming element regions ER each of which is electrically isolated by the element isolation regions STI. The word lines WL2 are formed above the element regions ER so as to intersect the element regions ER.

As shown in FIGS. 1 and 2, the word line WL2 is formed on a silicon oxide layer 201 (a first gate insulating film) that is formed on the semiconductor substrate 200. The word line WL2 also includes a poly crystalline silicon layer 204 that is used as a first floating gate, a poly crystalline silicon layer 205 that is used as a second floating gate, an ONO layer 206 that is used as a second gate insulating film, a control gate electrode comprised of a poly crystalline silicon layer 207 and a tungsten silicide layer 208 (WSi), and a TEOS layer 209 that was used as a mask layer to form a gate electrode.

Figure 4:
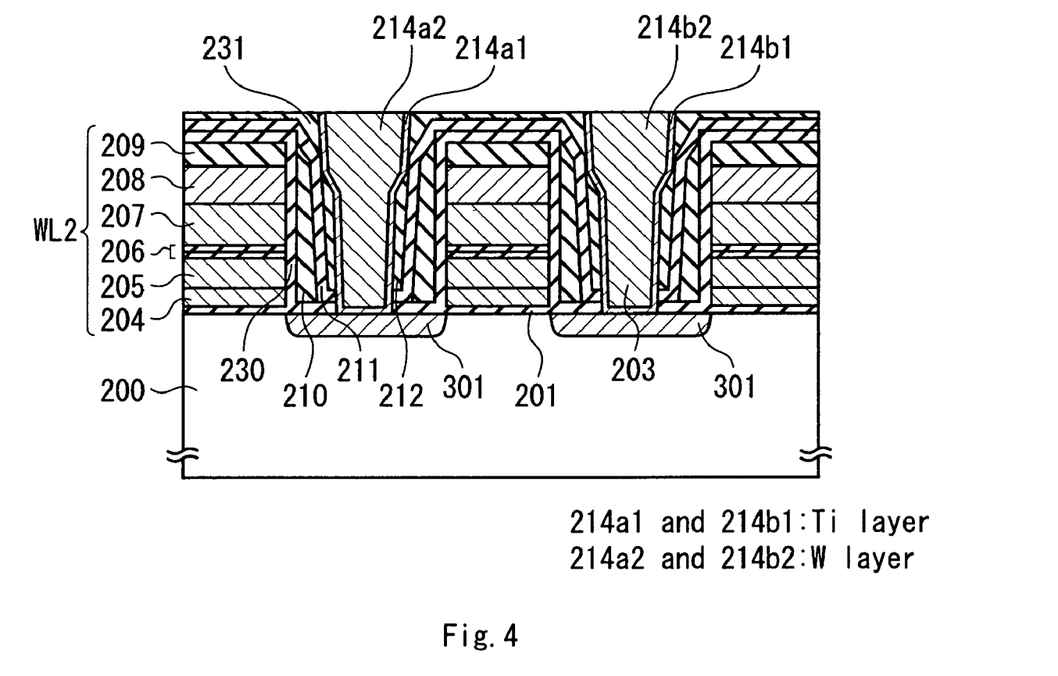
FIG. 4 shows a manufacturing step of the non-volatile memory device associated with a first embodiment of the present invention.
Figure 5:
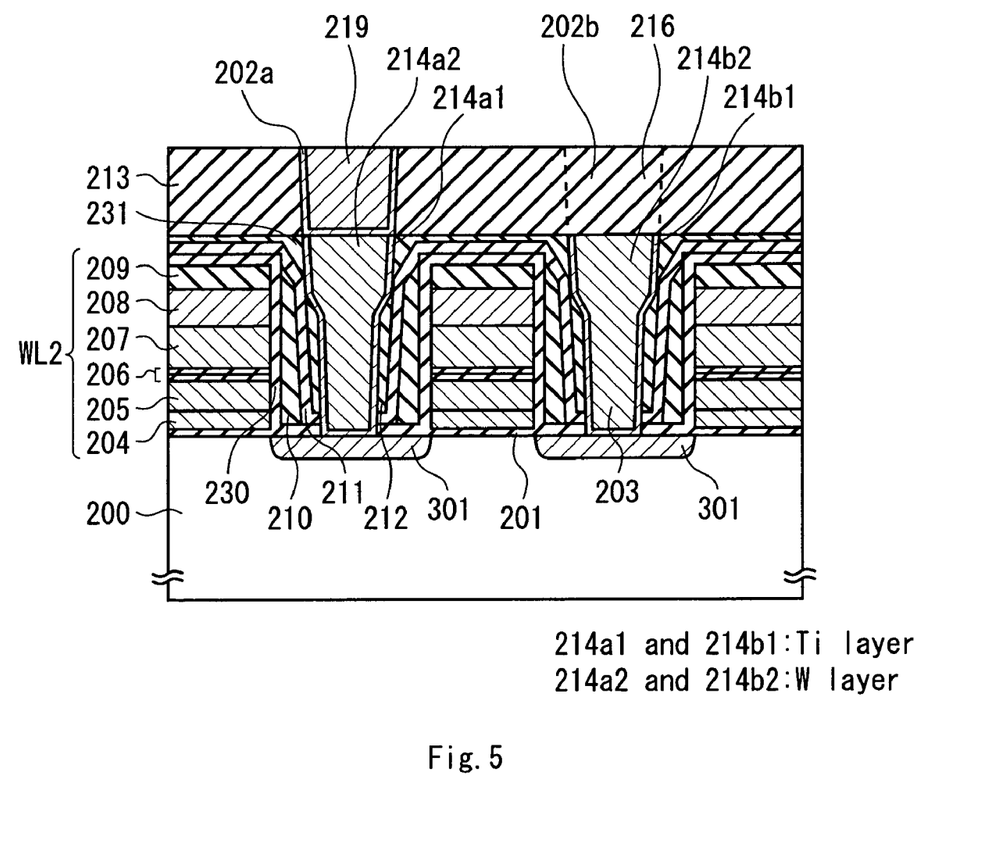
FIG. 5 shows a manufacturing step of the non-volatile memory device associated with the first embodiment of the present invention.

Manufacturing steps will be explain with reference to FIGS. 4 and 5. As shown in FIG. 4, the silicon oxide layer 201 is formed on the semiconductor substrate 200. The poly crystalline silicon layer 204, a silicon nitride layer (not shown), and a silicon oxide layer (not shown) are formed on the silicon oxide layer 204. A resist layer is then formed on the silicon oxide layer (not shown) and is processed into a pattern of a gate electrode by using a photolithography technique. Portions of the silicon nitride layer (not shown) and the silicon oxide layer (not shown) are removed by using a RIE method and the patterned photo resist layer as a mask. And then he patterned resist layer is removed. After that, portion of the poly crystalline silicon layer 204 is patterned by using a RIE method and the patterned silicon oxide layer (not shown).

Portions of the silicon oxide layer 201 and the silicon substrate 200 are removed by using a RIE method and the patterned poly crystalline silicon layer 204 as a mask, thereby forming trench grooves of STI (Shallow Trench Isolation) in an upper surface of the silicon substrate 200. After that, a silicon oxide layer (not shown) is formed on the upper surface of the silicon substrate 200 and an inner wall of the trench grooves of the STI by using a thermal oxide method.

A silicon oxide layer (not shown) is formed in the trench grooves of the STI so as to fulfill the trench grooves of the STI by using a HDP (High Density Plasma) method. The silicon oxide layer (not shown) is removed and flattened so as to expose an upper surface of the poly crystalline silicon 204 by using a CMP (Chemical Mechanical Polish) method.

The silicon nitride layer (not shown) that is formed on the silicon oxide layer (not shown) is then removed by using a phosphorous acid process. A poly crystalline silicon 205 to which phosphorus (P) is doped is formed by using a low pressure CVD method and is patterned into gate electrodes by using a RIE method.

An ONO layer 206, a P doped poly crystalline silicon 207, a WSi layer 208, and a silicon oxide layer 209 are formed by using a low pressure CVD method. A patterned photo resist layer (not shown) is formed on the silicon oxide layer 209 by using a photolithography technique. Portions of he silicon oxide layer 209 are removed by using a RIE method and the patterned photo resist layer as a mask.

Portions of the WSi layer 208, the poly crystalline silicon layer 207, the ONO layer 206, the poly crystalline silicon layers 205 and 204 are removed by using a RIE method and the patterned silicon oxide layer 209 as a mask, thereby forming the word lines WL2 (gate electrodes). A silicon oxide layer 230 is then formed on the side and top surfaces of each of the word lines WL2.

Impurities are then injected into the region where source and drain regions (not shown) are to be formed by using an ion implantation method and the word lines WL2 as a mask, thereby forming diffusion layers 301. A silicon nitride layer 210 is then formed by using a low pressure CVD method and portions of the silicon nitride layer 210 is removed by using a RIE method, thereby forming side wall insulating films on the side surfaces of the word lines WL2.

A silicon nitride layer 211 is then formed on the silicon nitride layer 210. A silicon oxide layer 212 is then formed on the silicon nitride layer 211 by using a CVD method, and is removed so as to expose an upper surface of the silicon nitride layer 211 by using a CMP method. And then, a silicon oxide layer 231 is formed by using a plasma CVD method. The silicon oxide layer 231 is then flattened by using a CMP method not so as to expose the upper surface of the silicon nitride layer 211 that is formed above the gate electrode. In this case, the silicon oxide layer 231 remains above the gate electrode. Therefore, when a contact hole 219 that will be mentioned later is formed, even if the contact hole 219 gets out of right position, the silicon oxide layer 231 that is formed above the gate electrode prevents the contact hole 219 from reaching the gate electrode.

It is noted that the silicon oxide layer 231 may be flattened by using a CMP method so as to expose the upper surface of the silicon nitride layer 211 that is formed above the gate electrode. In this case, a height of the silicon oxide layer 231 can be lowered. In this result, we can get a low etching ratio.

After that, a drain contact 202a and a source line 203 will be formed as follows. As shown in FIG. 4, a photo resist layer (not shown) is formed on the silicon nitride layer 231. By using a photolithography technique and a same photo mask, the photo resist layer is patterned into a mask by which the drain contact 202a and the source line 230 are to be formed. And then, portions of the silicon oxide layer 231 and the silicon oxide layer 212 are removed by using a RIE method and the patterned photo resist layer as a mask. The patterned photo resist layer is then removed.

Portions of the silicon nitride layer 211 are removed so as to expose the upper surface of the semiconductor substrate 200 by using a RIE method. Ti layers 214a, 214b and W layers 214a, 214b are then formed, thereby forming the drain contact 202a and the source line 203. Portions of the Ti layers 214a, 214b and W layers 214a, 214b are removed and flattened so as to expose an upper surface of the silicon oxide layer 231 by using a CMP method. It should be noted that this embodiment of the present invention is different from the conventional non-volatile semiconductor memory device in that the drain contact and the source line are formed simultaneously.

As shown in FIG. 5, a silicon oxide layer 213 is formed and a resist layer (not shown) is then formed on the silicon oxide layer 213. The photo resist layer is patterned into a predetermined pattern by using a photolithography technique and a same photo mask. Portions of the silicon oxide layer 213 are then removed by using a RIE method and the patterned photo resist layer as a mask, thereby simultaneously forming a contact hole 219 that is connected to the bit line 215 (See FIG. 1) and the drain contact 202a, and a contact hole 216 (shadowed) by which the source line 203 is connected to another line (not shown) that is formed in a same layer as the bit line 215.

From this embodiment of the present invention, the same photo mask can be used at the manufacturing step of the drain contact 202a and the source line 203. Moreover, the same mask can be used at the manufacturing step of the contact holes 219 and 216. Therefore, a height of the drain contact 202a is the same as that of the source line 203, and a height of the contact hole 219 is the same as that of the contact hole 216. From this, the aspect ratio of the drain contact 202a can be made lower, thereby resulting in preventing a poor conduction.

As stated above, in the conventional technique, a photo mask by which the drain contact is formed is different from a photo mask by which the source line. On the other hand, in this embodiment of the present invention, the photo mask by which the drain contact 202a is formed is the same as photo mask by which the source line 203 is formed. Therefore, it can enhance a precision of patterning, resulting in preventing a poor conduction as even downsizing progressed.

In this embodiment of the present invention, a NOR type non-volatile memory device is explained. However, it is noted that it can be an NAND type non-volatile memory device.

Figure 9:
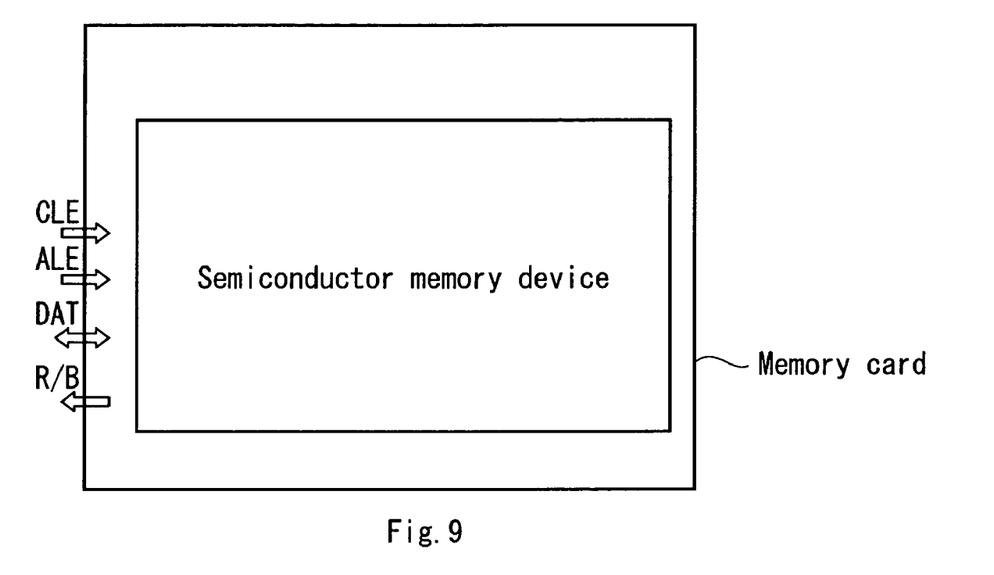
FIG. 9 shows a diagram of a memory card in which a semiconductor memory device is arranged.

We will explain about applications having an above-mentioned semiconductor memory device. A memory card having the above mentioned semiconductor memory device is shown in FIG. 9. As shown in FIG. 9, the semiconductor memory device receives/outputs predetermined signals and data from/to an external device (not shown).

Figure 10:
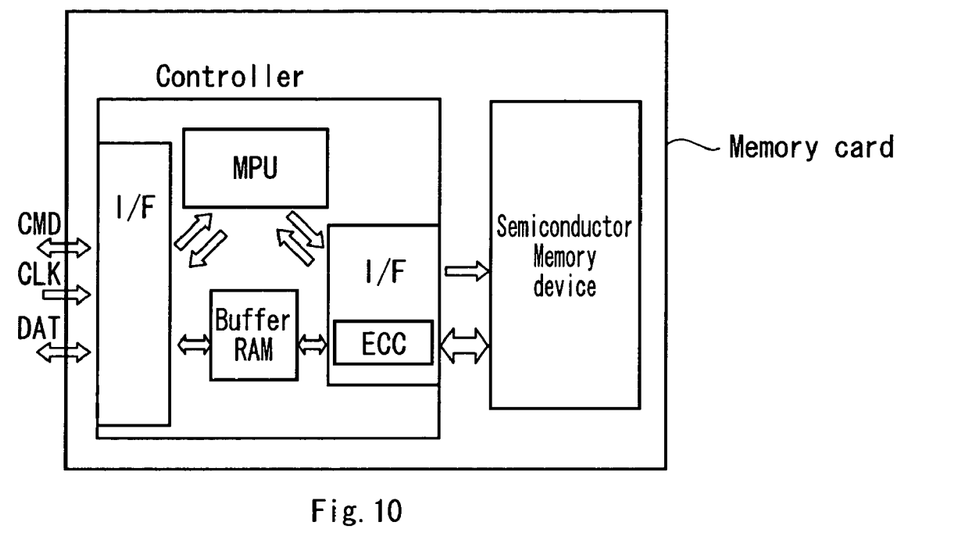
FIG. 10 shows a diagram of a memory card in which a semiconductor memory device and a controller are arranged.

A signal line (DAT), a command line enable signal line (CLE), an address line enable signal line (ALE) and a ready/busy signal line (R/B) are connected to the memory card having the above mentioned semiconductor memory device. The signal line (DAT) transfers data, address or command signals. The command line enable signal line (CLE) transfers a signal which indicates that a command signal is transferred on the signal line (DAT). The address line enable signal line (ALE) transfers a signal which indicates that an address signal is transferred on the signal line (DAT). The ready/busy signal line (R/B) transfers a signal which indicates whether the memory device is ready or not. Another example of a memory card is shown in FIG. 10. The memory card shown in FIG. 45 differs from the memory card presented in FIG. 9 in that the memory card includes a controller which controls the semiconductor memory device and receives/transfers predetermined signals from/to an external device (not shown).

The controller includes an interface unit (I/F), a micro processor unit (MPU), a buffer RAM and an error correction code unit (ECC). The interface unit (I/F) receives/outputs predetermined signals from/to an external device (not shown). The micro processor unit converts a logical address into a physical address. The buffer RAM stores data temporarily. The error correction code unit generates an error correction code. And a command signal line (CMD), a clock signal line (CLK) and a signal line (DAT) are connected to the memory card.

Although we explain about the memory cards as shown above, the number of the control signal lines, bit width of the signal line (DAT) and a circuit construction of the controller could be modified suitably.

Figure 11:
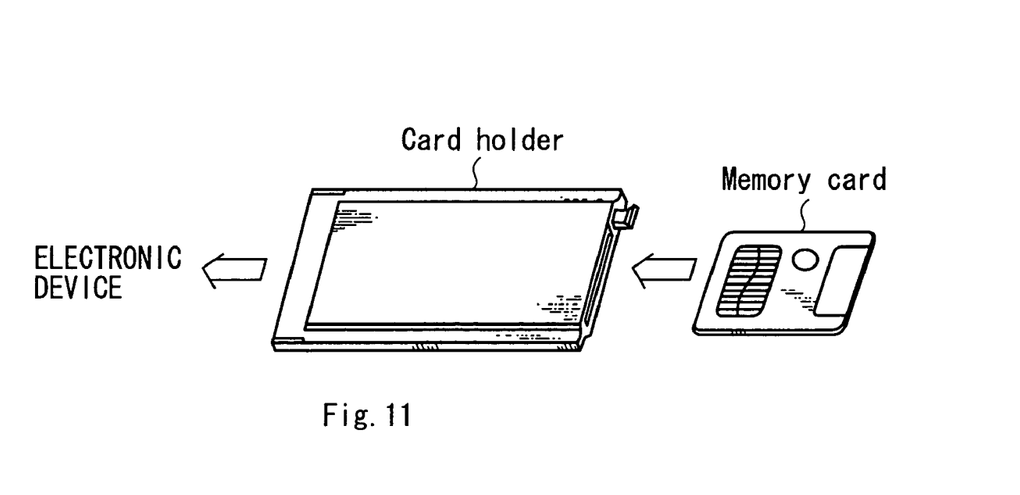
FIG. 11 shows a diagram of a card holder to which a memory card is inserted.

Another application is shown in FIG. 11. A memory card holder to which the memory card is inserted, is shown in FIG. 11. And the card holder is connected to electronic device (not shown). The card holder may have a part of the functions of the controller.

Figure 12:
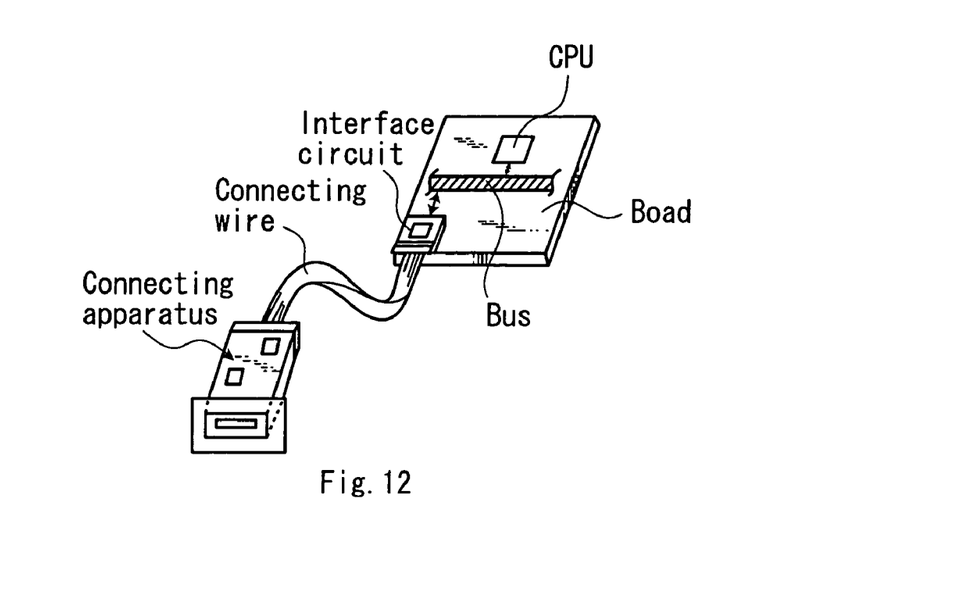
FIG. 12 shows a diagram of a connecting apparatus, a board, and a connecting wire.

Another application is shown in FIG. 12. As shown in FIG. 12, the memory card or the card holder to which the memory card is inserted, is inserted to a connecting apparatus. The connecting apparatus is connected to a board via a connecting wire and an interface circuit. The board has a CPU (Central Processing Unit) and a bus.

Figure 13:
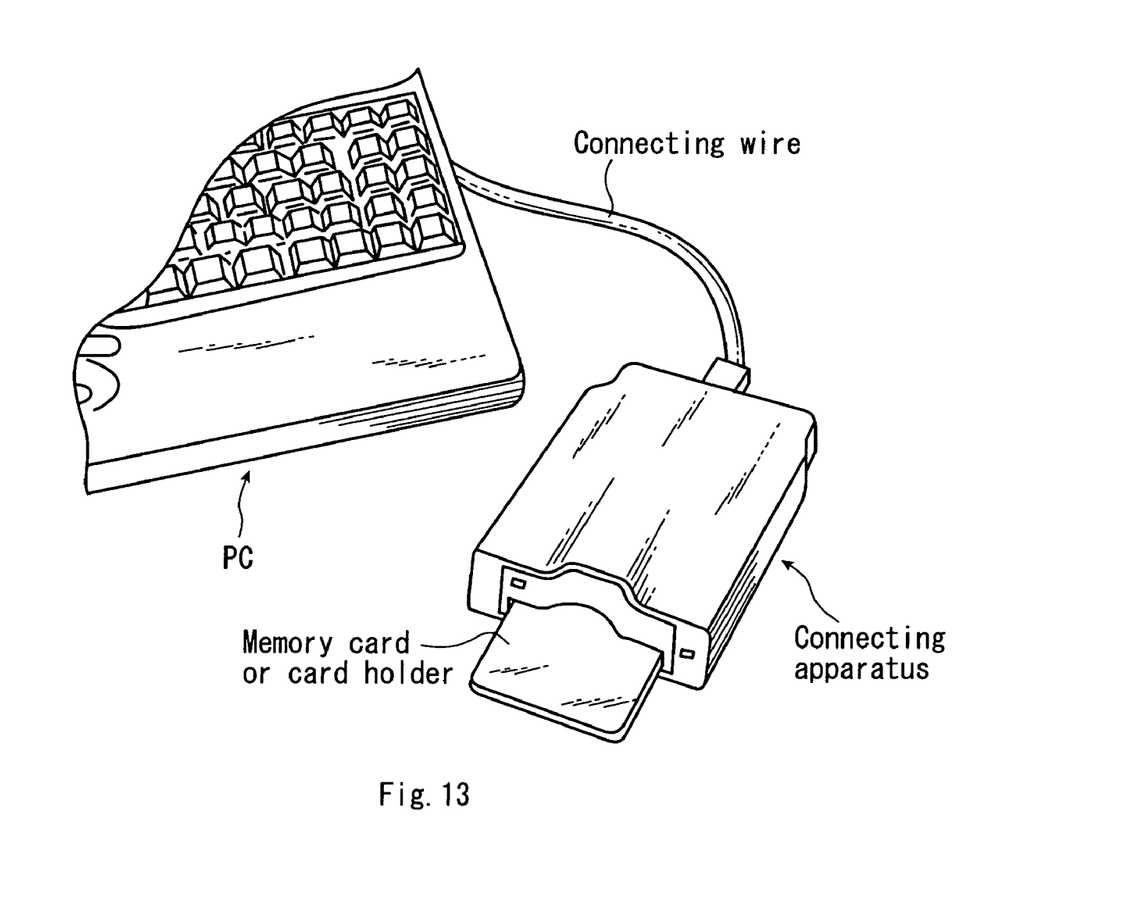
FIG. 13 shows a diagram of a PC, a connecting apparatus, and a connecting wire.

Another application is shown in FIG. 13. As shown in FIG. 13, the memory card or the card holder to which the memory card is inserted, is inserted to a connecting apparatus. The connecting apparatus is connected to PC (Personal Computer) via connecting wire.

Figure 14:
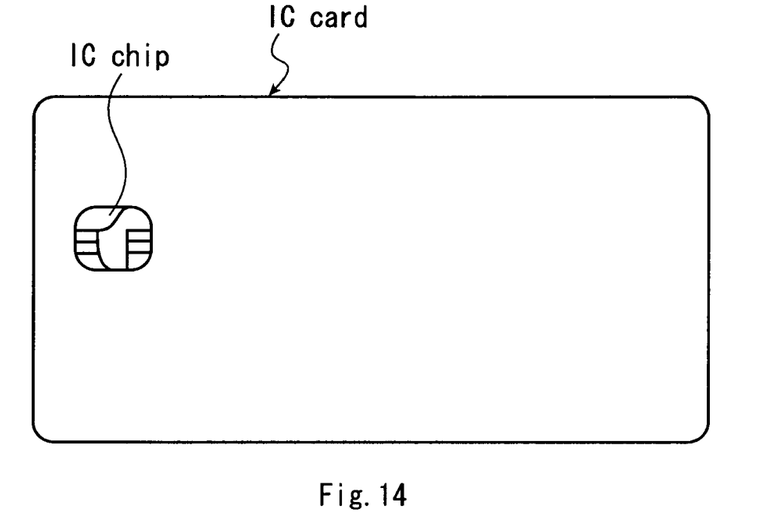
FIG. 14 shows a diagram of an IC chip including a semiconductor memory device, and an IC card on which the IC card is allocated.
Figure 15:
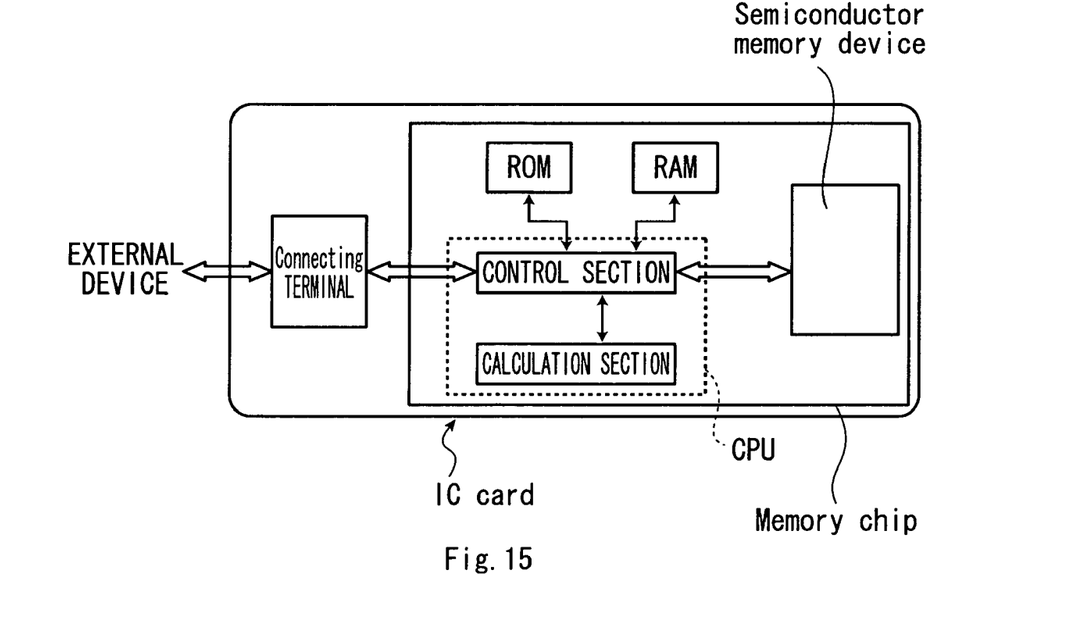
FIG. 15 shows a schematic diagram of an IC card and an IC chip.

Another application is shown in FIGS. 14 and 15. As shown in FIG. 14, An IC chip that includes the above-mentioned semiconductor memory device is located on an IC card that is made of plastic or something like that. FIG. 15 shows a detail block diagram of the IC card and the IC chip presented in FIG. 14. The IC chip has a connecting terminal that is configured to connect to an external device (not shown), and a memory chip that includes the above-mentioned semiconductor memory device, a ROM, a RAM, and a CPU. The CPU contains a calculation section and a control section that is configured to connect to the semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A semiconductor memory device comprising:
    a first memory cell having a first gate electrode, a first diffusion layer and a second diffusion layer, the first and second diffusion layers arranged in a semiconductor substrate to be adjacent to the first gate electrode;
    a first contact layer connected to the first diffusion layer of the first memory cell;
    a second contact layer connected to the first contact layer;
    a first bit line connected to the second contact layer and arranged above the first gate electrode of the first memory cell;
    a second memory cell having a second gate electrode, a third diffusion layer and a fourth diffusion layer, the third and fourth diffusion layers arranged in a semiconductor substrate to be adjacent to the second gate electrode, the second gate electrode of the second memory cell electrically connected to the first gate electrode of the first memory cell, the first and second memory cells arranged in a direction perpendicular to the first bit line;
    a third contact layer connected to the third diffusion layer of the second memory cell;

a fourth contact layer connected to the third contact layer;
a second bit line connected to the fourth contact layer, arranged above the second gate electrode of the second memory cell, and arranged parallel to the first bit line;
an element isolation insulating layer formed in an upper portion of the semiconductor substrate and arranged between the first and second memory cells; and
a conductive layer commonly connected to the second diffusion layer of the first memory cell and the fourth diffusion layer of the second memory cell, a height of the conductive layer substantially being coplanar with a height of the first contact layer, the conductive layer formed to be contact with the element isolation insulating layer that is arranged between the second diffusion layer of the first memory cell and the fourth diffusion layer of the second memory cell.

2. The semiconductor memory device according to claim 1, wherein the first contact layer includes a W layer.

3. The semiconductor memory device according to claim 1, wherein the first contact layer includes a first conductive film and a second conductive film.

4. The semiconductor memory device according to claim 3, wherein the first conductive film is Ti.

5. The semiconductor memory device according to claim 3, wherein the second conductive film is W.

6. The semiconductor memory device according to claim 1, wherein the semiconductor memory device is one of a NAND type nonvolatile memory device and a NOR type memory device.

7. A memory card including the semiconductor memory device recited in claim 1.

8. A card holder to which the memory card recited in claim 7 is inserted.

9. A connecting device to which the memory card recited in claim 7 is inserted.

10. The connecting device according to the claim 9, the connecting device is configured to be connected to a computer.

11. A memory card including the semiconductor memory device recited in claim 1 and a controller which controls the semiconductor memory device.

12. A card holder to which the memory card recited in claim 11 is inserted.

13. A connecting device to which the memory card recited in claim 11 is inserted.

14. The connecting device according to the claim 13, the connecting device is configured to be connected to a computer.

15. An IC card on which an IC chip that includes the semiconductor memory device recited in claim 1 is located.

16. A semiconductor memory device, comprising:
a plurality of memory cells each of which includes a gate electrode and first and second diffusion layers;
an element isolation insulating layer formed in a semiconductor substrate and between the plurality of memory cells;
an insulating film formed above side and top surfaces of each gate electrode of the plurality of memory cells;
a first interlayer insulating layer formed between two gate electrodes adjacent to each other;
a first contact layer formed in the first interlayer insulating layer and connected to the first diffusion layer;
a second interlayer insulting layer formed on the first interlayer insulating layer;
a second contact layer formed in the second interlayer insulating layer and connected to the first contact layer;
a bit line connected to the second contact layer; and
a conductive layer connected to at least two of the second diffusion layers, the conductive layer formed between the two gate electrodes adjacent to each other being arranged in a direction vertical to the bit line, a height of the conductive layer substantially being coplanar with a height of the first contact layer, wherein the height of the conductive layer is approximately uniform and a bottom surface of the conductive layer is in contact with the at least two of the second diffusion layers and an upper surface of the element isolation insulating layer.

17. The semiconductor memory device according to claim 16, wherein the first contact layer includes a W layer.

18. The semiconductor memory device according to claim 16, wherein a position of a top surface of the insulating film formed above the gate electrode of the plurality of memory cells is coplanar with the top surface of the first interlayer insulating layer.

19. The semiconductor memory device according to claim 16, wherein a position of a top surface of the insulting film formed above the gate electrode of the plurality of memory cells is different from that of the top surface of the first interlayer insulating layer.

20. The semiconductor memory device according to claim 16, wherein the conductive layer is a source line.

21. The semiconductor memory device according to claim 16, wherein the plurality of memory cells is one of a NAND type nonvolatile memory device and a NOR type memory device.

22. A memory card including the plurality of memory cells recited in claim 16.

23. A card holder to which the memory card recited in claim 22 is inserted.

24. A connecting device to which the memory card recited in claim 22 is inserted.

25. The connecting device according to the claim 24, the connecting device is configured to be connected to a computer.

26. A memory card including the plurality of memory cells recited in claim 16 and a controller which controls the plurality of memory cells.

27. A card holder to which the memory card recited in claim 26 is inserted.

28. A connecting device to which the memory card recited in claim 26 is inserted.

29. The connecting device according to the claim 28, the connecting device is configured to be connected to a computer.

30. An IC card on which an IC chip that includes the plurality of memory cells recited in claim 26 is located.

* * * * *